United States Patent [19]
Choi et al.

[11] Patent Number: 5,706,246
[45] Date of Patent: Jan. 6, 1998

[54] ADDRESS TRANSITION DETECTION CIRCUIT

[75] Inventors: Kyun-Kyu Choi; Yong-Weon Jeon, both of Seoul, Rep. of Korea

[73] Assignee: LG Semicon Co., Ltd., Chungcheongbuk-do, Rep. of Korea

[21] Appl. No.: 734,268

[22] Filed: Oct. 21, 1996

[30] Foreign Application Priority Data

Mar. 11, 1996 [KR] Rep. of Korea .................. 96-6310

[51] Int. Cl.$^6$ ........................................ G11C 8/00
[52] U.S. Cl. .................... 365/233.5; 365/230.08; 365/194; 326/93; 327/175; 327/176
[58] Field of Search ................ 365/233.5, 230.08, 365/194, 189.08; 326/93; 327/175, 176

[56] References Cited

U.S. PATENT DOCUMENTS

| | | |
|---|---|---|
| 4,343,082 | 8/1982 | Han et al. . |
| 4,592,028 | 5/1986 | Konishi ............................ 365/230 |
| 5,003,513 | 3/1991 | Porter et al. ...................... 365/230.08 |
| 5,198,708 | 3/1993 | Gillingham . |
| 5,438,550 | 8/1995 | Kim ..................................... 365/233.5 |
| 5,519,666 | 5/1996 | McAdams ........................ 365/233.5 |
| 5,625,604 | 4/1997 | Kim et al. ........................ 365/233.5 |

Primary Examiner—David C. Nelms
Assistant Examiner—Vu A. Le

[57] ABSTRACT

An address transition detection circuit for driving an internal circuit of a memory device, includes an address input circuit for generating an input logic operation signal by a logic operation of a chip select signal and an address signal, a latch circuit for generating first and second latch signals, a feedback circuit for generating a feedback signal, first and second delay circuits for generating first and second delay signals by delaying the first and second latch signals for a prescribed delay time, and an address transition detection signal output circuit for receiving the first and second latch signals and the first and second delay signals, and generating an address transition detection signal having a pulse width longer than at least the twice the prescribed delay time of the first or second delay circuit when the address signal changes, thereby preventing malfunction of the memory device.

32 Claims, 5 Drawing Sheets

ADDRESS TRANSITION DETECTION CIRCUIT

BACKGROUND OF THE INVENTION

The present invention relates to an address transition detection circuit of a memory device, and more particularly to an address transition detecting circuit for preventing a malfunction by detecting an address transition signal having a pulse width necessary for an internal circuit, irrespective of the length of the pulse width of an address signal supplied to the memory device.

Address transition detection circuits equalize and precharge a data bus line of a memory device by generating an address transition detection signal having a constant width each time an input address varies. The address transition detection signal should have prescribed or more widths in order to stably, operate an internal circuit by the sufficient equalization and precharge of a synchronized data bus line.

FIG. 1 illustrates a conventional address transition detection circuit. The conventional address transition detection circuit includes an address input circuit 110, a latch circuit 120, first and second delay circuits 130 and 140, and an address transition detection signal output circuit 150. The address input circuit 110 includes a NOR gate N01 for NORing a chip select signal $\overline{CS}$ with an address signal ADS. Since the chip select signal $\overline{CS}$ is activated at logic "low", the address input circuit 110 generates a signal having a phase opposite to the address signal ADS.

The latch circuit 120 includes an inverter I11, and NAND gates NA11 and NA12. The NAND gate NA11 has a first input terminal receiving the output of the NOR gate N01 inverted by the inverter I11, and a second input terminal. The NAND gate NA12 has a first input terminal directly receiving the output of the NOR gate N01, and a second input terminal. The second input terminals of the NAND gates NA11 and NA12 respectively receive the outputs of the NAND gates NA12 and NA11, and the NAND gates NA11 and NA12 generate signals having a phase opposite to each other by inverting the input signals applied to the first input terminals of the NAND gates NA11 and NA12. If an input signal of logic "low" is supplied to first input terminal of the NAND gates NA11, the NAND gate NA11 generates an output signal of logic "high", irrespective of the logic state of an input signal being applied to its second input terminal. If an input signal of logic "high" is supplied to the first input terminal of the NAND gate NA11, a signal of logic "low" is applied to the first input terminal of the NAND gate NA12 which causes the output of the NAND gate NA12 to be at logic "high". This means that the NAND gate NA11 generates an output signal of logic "low" since a signal of logic "high" is applied to the second terminal of the NAND gate NA11. If there is no variation in the input address signal ADS, the outputs of the? NAND gates NA11 and NA12 are maintained.

The first delay circuit 130 has inverters I12 and I13 connected in series, and the second delay circuit 140 has inverters I14 and I15 connected in series. The first and second delay circuits 130 and 140 delay for a prescribed time the outputs of the NAND gates NA11 and NA12, respectively.

The address transition detection signal output circuit 150 has a CMOS flip-flop construction consisting of PMOS transistors P11–P14 and NMOS transistors N11–N14. The PMOS and NMOS transistors P11, P12, N11 and N12 are connected in series between a power voltage terminal Vdd and a ground voltage terminal. Similarly, the transistors P13, P14, N13 and N14 are connected in series between the power voltage terminal Vdd and the ground voltage terminal. The output of the first delay circuit 130 is connected to the gates of the PMOS and NMOS transistors P11 and N14, and the output of the second delay circuit 140 is connected to the gates of the PMOS and NMOS transistors P13 and N12. The output of the NAND gate NA11 is connected to the gate of the PMOS and NMOS transistors P12 and N11, and the output of the NAND gate NA12 is connected to the gates of the PMOS and NMOS transistors P14 and N13. A common drain between the PMOS and NMOS transistors P12 and N11 and between the PMOS and NMOS transistors P14 and N13 is an output terminal generating an address transition detection signal ATDS. The address transition detection signal ATDS is activated at logic "low" and drives an internal circuit at that state.

In operation, the chip select signal $\overline{CS}$ and the address signal ADS having a pulse width longer than the address transition detection signal ATDS necessary for the internal circuit are supplied to the NOR gate N01. If the address signal ADS is logic "high" or "low", the NOR gate N01 generates a logic "low" or "high" signal having an opposite phase to the input address signal ADS by the chip select signal $\overline{CS}$ of logic "low".

If the address signal ADS of logic "low" and the chip select signal of logic "low" are applied to the NOR gate N01, a logic "high" signal is output to the latch circuit 120. The logic "high" signal generated from the NOR gate N01 is supplied to the first input terminal of the NAND gate NA11 through the inverter I11 and directly to the first input terminal of the NAND gate NA12. Therefore, the NAND gate NA11 outputs a logic "high" signal regardless of the logic state of a signal being applied to its second input terminal. The logic "high" signal generated from the NAND gate NA11 is fed to the second input terminal of the NAND gate NA12 and, therefore, the NAND gate NA12 outputs a logic "low" signal.

The logic "high" signal produced from the NAND gate NA11 is supplied directly to the gates of the PMOS and NMOS transistors P12 and N11 of the address transition detection signal output circuit 150. The logic "low" signal generated from the NAND gate NA12 is applied directly to the gates of the PMOS and NMOS transistors P14 and N13. Further, the logic "high" signal generated from the NAND gate NA11 is delayed for a prescribed time through the first delay circuit 130 and then supplied to the gates of the PMOS and NMOS transistors P11 and N14. Similarly, the logic "low" signal generated from the NAND gate NA12 is delayed for a prescribed time through the second delay circuit 140 and then applied to the gates of the PMOS and NMOS transistors P13 and N12. The PMOS transistors P13 and P14 are turned on by the logic "low" signal applied to their gates, and the address transition detection signal ATDS of logic "high" is generated. Hence, the internal circuit is not driven.

If the address signal ADS of logic "high" is applied to the NOR gate NO1, the NOR gate N01 generates a logic "low" signal. Then the NAND gate NA12 of the latch circuit 120 always generates a logic "high" signal, and the NAND gate NA11 generates a logic "low" signal. The first and second delay circuits 130 and 140 delay the outputs of the NAND gates NA11 and NA12, and generate the logic "low" and "high" signals, respectively. Then the PMOS transistors P11 and P12 are turned on. Therefore, the address transition detection signal ATDS of logic "high" is generated and the internal circuit is not driven.

However, if the address signal ADS is changed from logic "low" to "high" or from "high" to "low", the NOR gate N01 generates a signal having a phase opposite to the address signal ADS, changed from logic "high" to "low" or from "low" to "high".

If the address signal ADS changes from logic "low" to "high" or from logic "high" to "low", the NOR gate N01 generates a signal changed from logic "high" to "low" or from logic "low" to "high". That is, if the address signal ADS changes from logic "low" to "high", the NOR gate N01 generates a signal changed from logic "high" to "low". The signal generated from the NOR gate N01 is supplied to the first input terminal of the NAND gate NA11 through the inverter Il1 and directly to the first input terminal of the NAND gate NA12. Therefore, the NAND gate NA12 generates a signal changed from logic "low" to "high" regardless of the logic state of the signal being applied to its second input terminal. Then the output signal of the NAND gate NA12 changed from logic "low" to "high" is applied to the second input terminal of the NAND gate NA11 and then the NAND gate NA11 generates a signal changed from logic "high" to low".

Then the output signal of the NAND gate NA11 changed from logic "high" to "low" is supplied to the gates of the PMOS and NMOS transistors P12 and N11 of the address transition detection signal output circuit 150. Then the PMOS transistor P12 is turned on and the NMOS transistor N11 is turned off. On the other hand, the output signal of the NAND gate NA12 changed from logic "low" to "high" is applied to the gates of the PMOS and NMOS transistors P14 and N13. Thus, the PMOS transistor P14 is turned off and the NMOS transistor N13 is turned on. Since the first and second delay circuits 130 and 140 delay the outputs of the NAND gates NA11 and NA12, the logic "high" and "low" signals generated when the address signal ADS is at logic "low", are supplied to the gates of the PMOS and NMOS transistors P11 and N14 and to the gates of the PMOS and NMOS transistors P13 and N12, respectively. The NMOS and PMOS transistors N14 and P13 are maintained at on state. Therefore, the address transition detection signal ATDS is set to logic "low" and the internal circuit is driven.

If a prescribed time elapses, the first and second delay circuits 130 and 140 generate the signal of the NAND gate NA11 changed from logic "high" to "low" and the signal of the NAND gate NA12 changed from logic "low" to "high", respectively, and the PMOS and NMOS transistors P11 and N12 are turned on. Since the PMOS transistor P12 is at on-state and the NMOS transistor N11 is at off-state, the address transition detection signal ATDS is set to logic "high" and the internal circuit is not driven. Consequently, the address transition detection signal ATDS is maintained at logic "low" only during the prescribed delay time set by first and second delay circuits 130 and 140 and thus the internal circuit is driven for the prescribed delay time.

Meanwhile, if the address signal ADS is changed from logic "high" to "low", the NOR gate 110 generates a signal changed from logic "low" to "high". The output signal of the NOR gate NO1 is inverted through the inverter I1 and supplied to the first input terminal of the NAND gate NA11. The NAND gate NA11 generates a signal changed from logic "low" to "high" regardless of the logic state of the signal at its second input terminal, and the NAND gate NA12 generates a signal changed from logic "high" to "low". Then the PMOS and NMOS transistors P14 and N11 are turned on. At this time, since the first and second delay circuits 130 and 140 respectively generate logic "low" and "high" signals generated when the address signal ADS is at logic "high", the PMOS and NMOS transistors P11 and N12 are maintained at on-state. Then, since the NMOS transistors N11 and N12 are at on-state, the address transition detection signal ATDS is set to logic "low" and the internal circuit is driven.

If a prescribed time elapses, since the first and second delay circuits 130 and 140 generate the signal of the NAND gate NA11 changed from logic "low" to "high" and the signal of the NAND gate NA12 changed from logic "high" to "low", respectively, the PMOS and NMOS transistors P14 and N11 are turned on. Since the PMOS transistor P13 is at on-state and the NMOS transistor N12 is at off-state, the address transition detection signal ATDS is set to logic "high" and the internal circuit is not driven. Therefore, the address transition detection signal ATDS is maintained at logic "low" only during the prescribed delay time set by the first and second delay circuits 130 and 140, and the internal circuit is driven for that delay time.

If the pulse width of the input address signal ADS is shorter than that of the address transition detection signal ATDS necessary for driving the internal circuit of a memory, i.e. the prescribed delay time of the first and second delay circuits 130 and 140, the address transition detection signal output circuit 150 generates the address transition detection signal ATDS by the outputs of the NAND gates NA11 and NA12 of the latch circuit 120. Therefore, the address transition detection signal ATDS has the same pulse width as the pulse width of the input address signal ADS, which is shorter than the prescribed delay time of the first and second delay circuits 130 and 140 necessary for driving the internal circuit of the memory.

As described above, if the pulse width of the address signal ADS is longer than that of the address transition detection signal ATDS necessary for driving the internal circuit, i.e. the prescribed delay time of the delay circuit, the address transition detection signal ATDS has the same pulse width as the prescribed delay time of the delay circuit. If the pulse width of the address signal ADS is shorter than that of the prescribed delay time of the delay circuit, the address transition detection signal ATDS having the same pulse width as the input address signal ADS is generated. However, since the address transition detection signal having the pulse width shorter than that necessary for driving the internal circuit does not sufficiently equalize and precharge the data bus line, the internal circuit operates unstably.

SUMMARY OF THE INVENTION

Accordingly, it is an object of the present invention to provide an address transition detection circuit which is capable of generating an address transition detection signal having a sufficient pulse width necessary for driving an internal circuit so as to prevent malfunction of a memory, irrespective of the pulse width of an address signal applied to the memory.

In accordance with one aspect of the present invention, an address transition detection circuit includes an address input circuit for generating an input logic operation signal by a logic operation of a chip select signal and an address signal, a latch circuit for generating first and second latch signals, a feedback circuit for generating a feedback signal, first and second delay circuits for generating first and second delay signals by delaying the first and second latch signals during a prescribed time, and an address transition detection signal output circuit for receiving the first and second latch signals and the first and second delay signals, and generating an address transition detection signal having a pulse width longer than at least twice the prescribed delay time of the first or second delay circuit when the address signal is changed. If the first and second latch signals have an opposite phase, the input logic operation signal is transferred to respective one input terminals of first and second NAND gates of the latch circuit by the feedback signal. If the first and second latch signals have the same phase, the input logic operation signal is not transferred to the first and second NAND gates.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The present invention will become more fully understood from the detailed description given hereinbelow and the accompanying drawings which are given by way of illustration only, and, thus, are not limitative of the present invention, and wherein.

Figure 1:
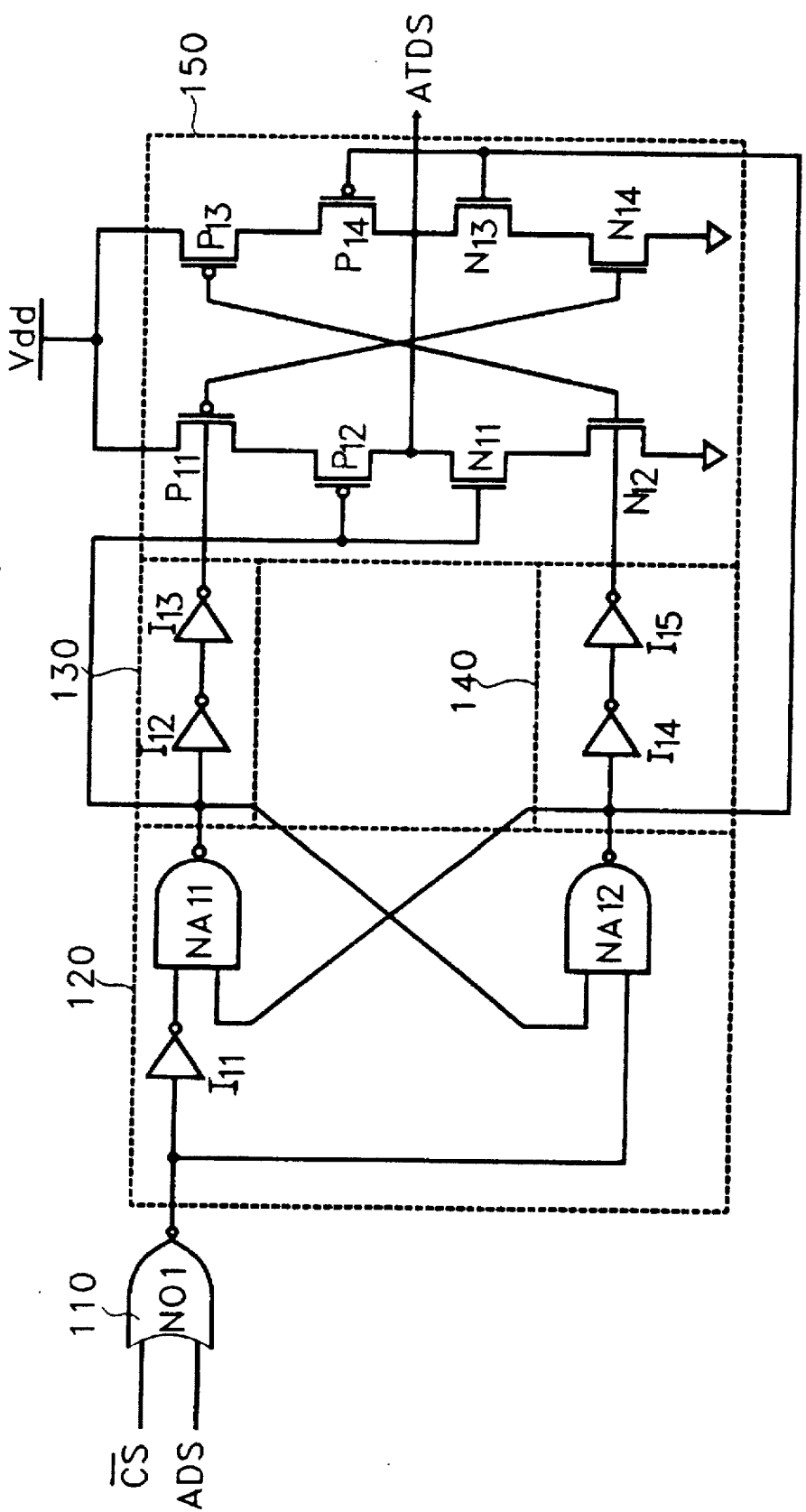
FIG. 1 is a circuit diagram of a conventional address transition detection circuit.
Figure 2:
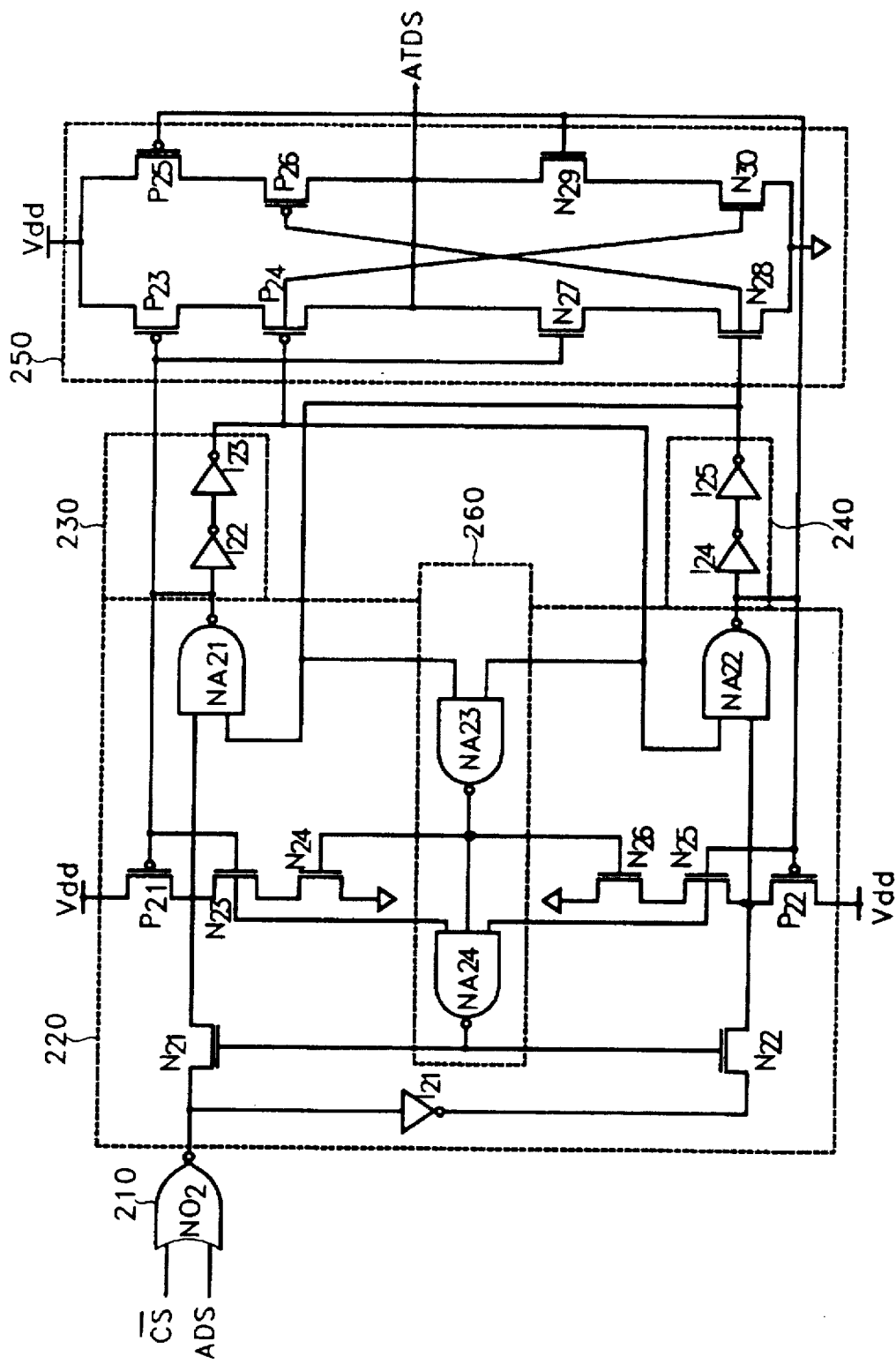
FIG. 2 is a circuit diagram of an address transition detection circuit according to the present invention.

FIGS. 4A to 4J are operational waveform charts for explaining the circuit of FIG. 2 when an address signal shorter than a delay time of first and second delay circuits is applied; and FIGS. 5A to 5J are operational waveform charts for explaining the circuit of FIG. 2 when an address signal which is longer than a delay time of first and second delay circuits and which is shorter than a minimum width of an address transition detection signal is applied.

DETAILED DESCRIPTION OF THE PREFERRED EMBODIMENTS

Referring to FIG. 2, an address detection circuit according to the present invention includes an address input circuit 210, a latch circuit 220, first and second delay circuits 230 and 240, an address transition detection signal output circuit 250 and a feedback circuit 260.

The address input circuit 210 has a NOR gate N02 for NORing a chip select signal $\overline{CS}$ with an address signal ADS. Since the chip select signal $\overline{CS}$ is activated at logic "low", the address input circuit 210 generates an input logic operation signal having a phase opposite to the address signal ADS.

The latch circuit 220 includes an inverter I21, passive-type NMOS transistors N21 and N22, first and second NAND gates NA21 and NA22, PMOS and NMOS transistors P21, N23 and N24 for adjusting the level of the first NAND gate NA21, and PMOS and NMOS transistors P22, N25 and N26 for adjusting the level of the second NAND gate NA22. The first NAND gate NA21 has a first input terminal receiving through the NMOS transistor N21 the input logic operation signal generated from the NOR gate N02. The second NAND gate NA22 has a first input terminal receiving through the NMOS transistor N22 the input logic operation signal inverted by the inverter I21. The first and second NAND gates NA21 and NA22 have second input terminals respectively receiving second and first delay signals respectively generated from the second and first delay circuits 240 and 230. The first and second NAND gates NA21 and NA22 generate respectively first and second latch signals by inverting a signal applied to their first input terminals, irrespective of the logic state of the second and first delay signals applied to their second input terminals. While the phase of the signal applied to the first input terminals is maintained, the phase of the first and second latch signals are also maintained.

The NMOS transistors N21 and N22 have gates receiving a second feedback signal generated from the feedback circuit 260. If the address signal ADS applied to the NOR gate N02 is changed, the NMOS transistors N21 and N22 prevent the input logic operation signal from being transferred to the first and second NAND gates NA21 and NA22, respectively. The PMOS and NMOS transistors P21, N23 and N24 are connected between a power voltage terminal Vdd and a ground voltage terminal. Similarly, the PMOS and NMOS transistors P22, N25 and N26 are connected between the power voltage terminal Vdd and the ground voltage terminal. The output of the first NAND gate NA21 is connected to the gates of the PMOS and NMOS transistors P21 and N23, and the output of the second NAND gates NA22 is connected to the gates of the PMOS and NMOS transistors P22 and N25. A first feedback signal generated from a NAND gate NA23 of the feedback circuit 260 is output to the gates of the NMOS transistors N24 and N26. The PMOS and NMOS transistors P21, N23 and N24 adjust the input level of the first NAND gate NA21 when the input logic operation signal is prevented from being transferred thereto by the NMOS transistor N21. Similarly, the PMOS and NMOS transistors P22, N25 and N26 adjust the input level of the second NAND gate NA22 when the input logic operation signal is prevented from being transferred thereto by the NMOS transistor N22.

The first delay circuit 230 for delaying for a prescribed time a first latch signal generated from the first NAND gate NA21 includes inverters I22 and I23. The second delay circuit 240 for delaying for a prescribed time a second latch signal generated from the second NAND gate NA22 includes inverters I24 and I25. If the inverters I22–I25 are of the same size, the first and second delay circuits 230 and 240 have the same delay time t.

The address transition detection signal output circuit 250 includes a CMOS flip-flop construction having PMOS transistors P23–P26 and NMOS transistors N27–N30. The PMOS transistors P23 and P24 and the NMOS transistors N27 and N28 are connected in series between the power voltage terminal Vdd and the ground voltage terminal. Similarly, the PMOS transistors P25 and P26 and the NMOS transistors N29 and N30 are connected in series between the power voltage terminal Vdd and the ground voltage terminal. The first latch signal generated from the first NAND gate NA21 is directly connected to the gates of the PMOS and NMOS transistors P23 and N27. The second latch signal generated from the second NAND gate NA22 is directly connected to the gates of the PMOS and NMOS transistors P25 and N29. A first delay signal output from the first delay circuit 230 is applied to the gates of the PMOS and NMOS transistors P24 and N30, and a second delay signal output from the second delay circuit 240 is applied to the gates of the PMOS and NMOS transistors P26 and N28. A common drain between the PMOS and NMOS transistors P24 and N27 and between the PMOS and NMOS transistors P26 and N29 is an output terminal generating an address transition detection signal ATDS. The address transition detection signal ATDS is activated at logic "low" and drives an internal circuit at that state.

The feedback circuit 260 includes third and fourth NAND gates NA23 and NA24. The third NAND gate NA23 receives the first and second delay signals and generates the first feedback signal. The first feedback signal generated from the third NAND gate NA23 is applied to the gates of the NMOS transistors N24 and N26 of the latch circuit 220. The fourth NAND gate NA24 receives the first and second latch signals generated from the first and second NAND gates NA21 and NA22, and the first feedback signal generated from the third NAND gate N23. The fourth NAND gate NA24 generates the second feedback signal and applies it to the gates of the NMOS transistors N21 and N22.

FIGS. 3A to 3J are operational waveform charts of the address transition detection circuit of FIG. 2 when an normal address signal ADS is supplied.

Figure 3:
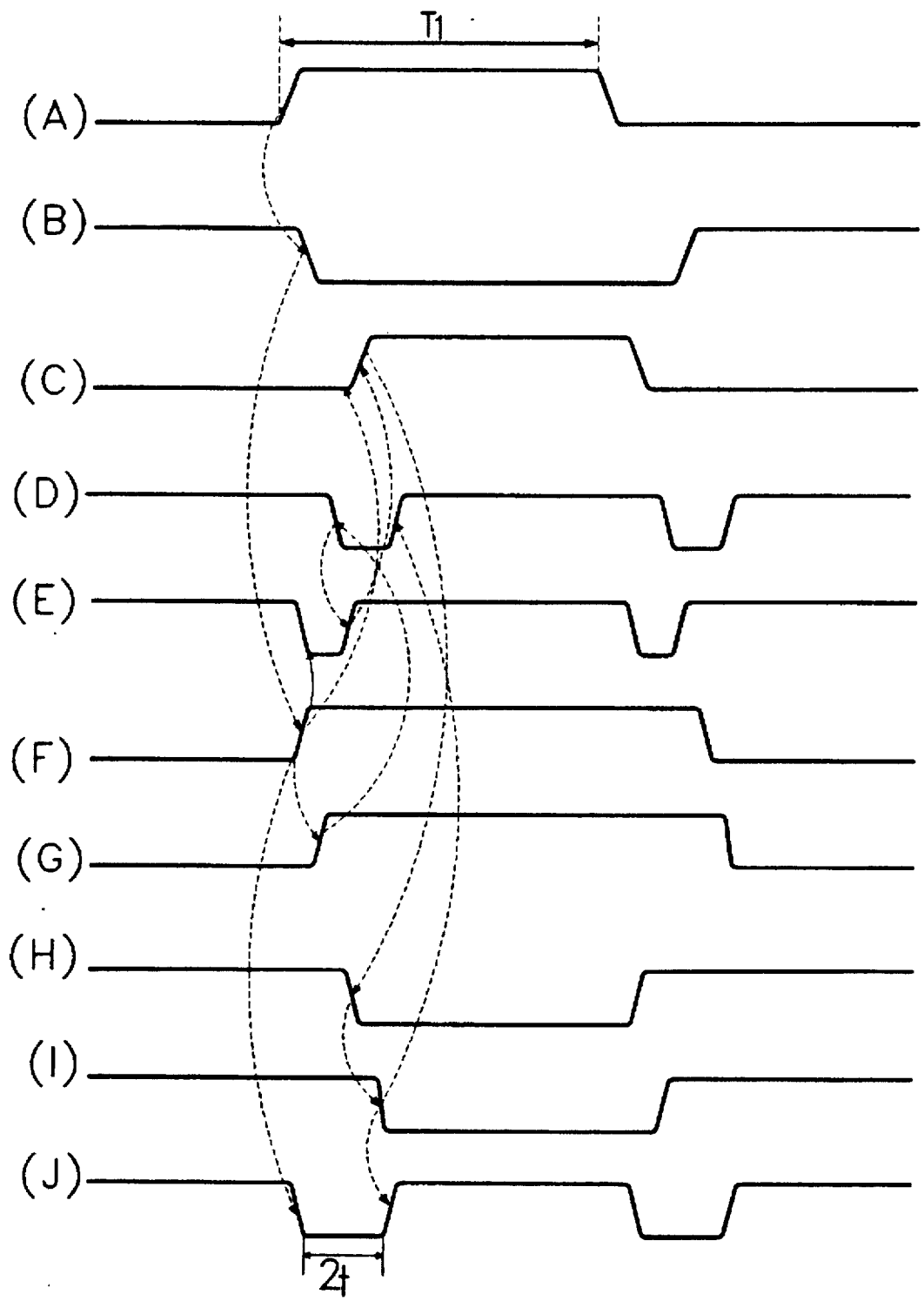
FIGS. 3A to 3J are operational waveform charts for explaining the circuit of FIG. 2 when a normal address signal is applied.

The chip select signal $\overline{CS}$ of logic "low", and the address signal ADS as shown in FIG. 3A are supplied to the NOR gate N02. The address signal ADS has a pulse width T1 longer than a minimum pulse width required to drive the internal circuit of the memory. If the address signal ADS changes from logic "low" to "high", the NOR gate N02 generates an input logic operation signal changed from logic "high" to "low". The first and second latch signals generated from the first and second NAND gates NA21 and NA22, and the first and second delay signals generated from the first and second delay circuits 230 and 240 are maintained at the previous state, i.e. when the address signal ADS is at logic "low". At the previous state, since the first latch signal and the first delay signal are at logic "low" and the second latch signal and the second delay signal are at logic "high", the fourth NAND gate NA24 generates the second feedback signal of logic "high" by the first latch signal of logic "low" and the second latch signal of logic "high". Thus, the NMOS transistors N21 and N22 are turned on.

Therefore, the input logic operation signal of the NOR gate NO2 changed from logic "high" to "low" as shown in FIG. 3B is directly applied to the first input terminal of the first NAND gate NA21. The second delay signal of logic "high" of the previous state is applied to the second input terminal of the first NAND gate NA21. The first latch signal generated from the first NAND gate NA21 is changed from logic "low" to "high" as shown in FIG. 3F. The PMOS transistor P23 of the address transition detection signal output circuit 250 is turned off and the NMOS transistor N27 is turned on. Since the NMOS transistor N28 is maintained at on state by the second delay signal of logic "high", the address transition detection signal ATDS is set to logic "low" as shown in FIG. 3J and an activated state is started.

Meanwhile, the input logic operation signal is inverted by the inverter I21, and the inverted input logic operation signal changed from logic "low" to "high" as indicated in FIG. 3C is applied to the first input terminal of the second NAND gate NA22. The first delay signal of logic "low" is supplied to the second input terminal of the second NAND gate NA22. Hence, the second latch signal generated from the second NAND gate NA22 is maintained at logic "high" irrespective of the inverted input logic operation signal applied to its first input terminal, as indicated in FIG. 3H.

The PMOS transistors P21 and P22 are turned off and the NMOS transistors N23 and N25 are turned on by the first and second latch signals of logic "high". Since the first feedback signal generated from the third NAND gate NA23 is maintained at logic "high" by the first and second delay signals of logic "low" and "high", the NMOS transistors N24 and N26 are turned on. Therefore, the first input terminals of the first and second NAND gates NA21 and NA22 are maintained at logic "low". Since the first and second latch signals and the first feedback signal are maintained at logic "high", the second feedback signal generated from the fourth NAND gate NA24 is changed from logic "high" to "low" as shown in FIG. 3E. Then the NMOS transistors N21 and N22 are turned off, and the input logic operation signal is prevented from being transferred to the first and second NAND gates NA21 and NA22. The first input terminals of the first and second NAND gates NA21 and NA22 are set to logic "low".

The first latch signal shown in FIG. 3F is delayed for a prescribed delay time t by the first delay circuit 130 and the second input terminal of the second NAND gate NA22 is set to logic "high". The third and fourth NAND gates NA23 and NA24 generate logic "low" and "high", respectively, and the NMOS transistors N21 and N22 are turned on. The first input terminal of the second NAND gate NA22 is set to logic "high", and the second latch signal is changed from logic "high" to "low" as shown in FIG. 3H. The second latch signal changed from logic "high" to "low" is delayed for the prescribed delay time t by the second delay circuit 140, and the second input terminal of the first NAND gate NA21 is set to logic "high" Since the first NAND gate NA21 has the first input terminal at logic "low", the first latch signal is maintained at logic "high".

If the first and second delay signals are at logic "high", the first feedback signal generated from the third NAND gate NA23 is set to logic "low", and the second feedback signal generated from the fourth NAND gate NA24 is set to logic "high". Then the NMOS transistors N24 and N26 are turned off, and the NMOS transistors N21 and N22 are turned on. Therefore, the NOR gate input logic operation signal of logic "low" is directly applied to the first input terminal of the first NAND gate NA21, and is also inverted to logic "high" by the inverter I21. The inverted input logic operation signal is supplied to the first input terminal of the second NAND gate NA22. Since the first and second delay signals applied to the second input terminals of the first and second NAND gates NA21 and NA22 are maintained at logic "high", the first and second latch signals are set to logic "high" and "low", respectively.

On the other hand, a voltage drop corresponding to a threshold voltage $V_T$ of the NMOS transistor N22 occurs in the input logic operation signal of the NOR gate NO2 applied to the first input terminal of the second NAND gate NA22 of the NOR gate NO2. However, since the PMOS transistor P22 is turned on by the second latch signal of logic "low" and the NMOS transistor N25 is turned off, a signal applied to the first input terminal of the second NAND gate NA22 is compensated in voltage by the power voltage terminal Vdd, and is set to logic "high". The PMOS transistor P25 of the address transition detection signal output circuit 250 is turned on and the NMOS transistor N29 is turned off, by the second latch signal set to logic "low". The second latch signal of the second NAND gate NA22 is supplied to the second delay circuit 240, and the second delay circuit 240 generates the second delay signal delayed by the prescribed time. Thus the PMOS transistors P25 and P26 are turned on. As a result, the address transition detection signal ATDS is set to logic "high" as shown in FIG. 3J and the activated state is completed.

In the above description, the address signal ADS changed from "low" to "high" has been described. Even if the address signal ADS is changed from "high" to "low", the NMOS transistors N29 and N30 are turned on during the delay time 2t of the first and second delay circuits 230 and 240, and the address transition detection signal ATDS is set to logic "high".

FIGS. 4A to 4J are operational waveform charts of the address transition detection circuit of FIG. 2 when the address signal ADS having a pulse width shorter than each delay time t of the first and second delay circuits 230 and 240 is applied.

Figure 4:
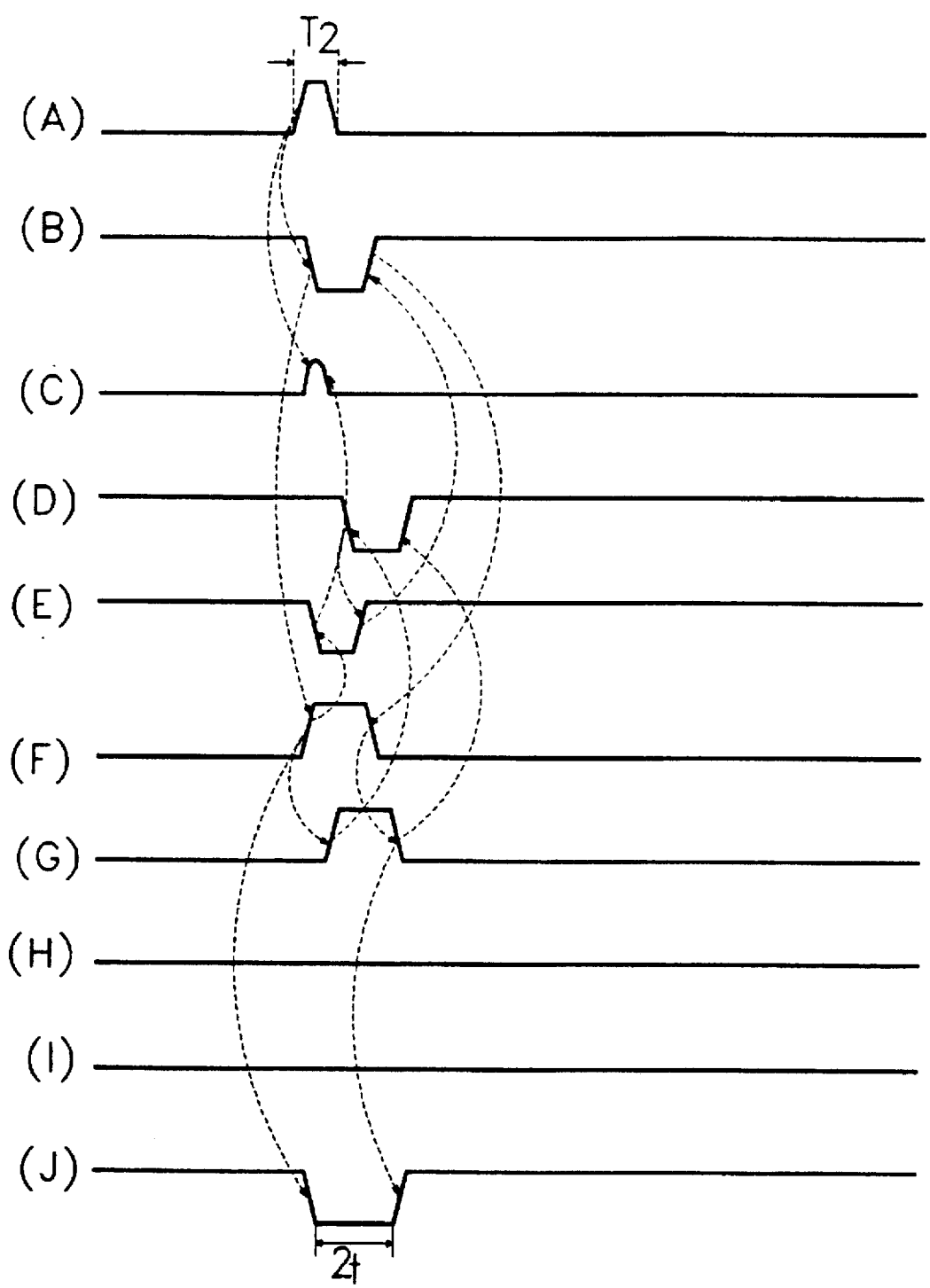

The chip select signal $\overline{CS}$ of logic "low" and the address signal ADS as indicated in FIG. 4A are supplied to the NOR gate N02. A pulse width T2 of the address signal ADS is shorter than one half of the minimum width 2t of the address transition detection signal ATDS required to drive the internal circuit of the memory (That is, t>T2). Before the NMOS transistors N21 and N22 are turned on, the address signal ADS is again set to logic "low".

If the address signal ADS is changed from logic "low" to "high", the NOR gate N02 generates the input logic operation signal changed from logic "high" to "low". Since the first and second latch signals generated from the first and second NAND gates NA21 and NA22, and the first and second delay signals generated from the first and second delay circuits 230 and 240 are maintained at the previous state, the NMOS transistor N21 and N22 are maintained at on state. Then a signal changed from "high" to "low" as shown in FIG. 4B is applied to the first input terminal of the first NAND gate NA21. The second delay signal of logic "high" of the previous state is applied to the second input terminal of the first NAND gate NA21. Therefore, the first latch signal is changed from logic "low" to "high" as shown in FIG. 4F. The PMOS transistor P23 of the address transition detection signal output circuit 250 is turned off and the NMOS transistor N27 is turned on. Since the NMOS transistor N28 is maintained at on state by the second delay signal of logic "high" of the previous state, the address transition detection signal ATDS is set to logic "low" as shown in FIG. 4J and the activated state is started.

Meanwhile, the input logic operation signal of the NOR gate NO2 is inverted by the inverter I21, and the inverted input logic operation signal changed from logic "low" to "high" as shown in FIG. 4C is applied to the first input terminal of the second NAND gate NA22. The first delay signal of logic "low" is supplied to the second input terminal of the second NAND gate NA22. Hence, the second latch signal generated from the second NAND gate NA22 is maintained at logic "high", irrespective of the inverted input logic operation signal applied to the first input terminal, as indicated in FIG. 3H.

Since the first and second delay signals generated from the first and second delay circuits 230 and 240 are at logic "low" and "high", respectively, the first feedback signal generated from the third NAND gate NA23 is at logic "high" as shown in FIG. 4D. The second feedback signal generated from the fourth NAND gate NA24 is changed from "high" to "low", and the NMOS transistors N21 and N22 are turned off. Therefore, the input logic operation signal of the NOR gate NO2 is prevented from being transferred to the first and second NAND gates NA21 and NA22. Then, the signal applied to the first input terminal of the first NAND gate NA21 is maintained at logic "low" as shown in FIG. 4B. The signal applied to the first input terminal of the second NAND gate NA22 is changed from logic "high" to "low" as shown in FIG. 4C. Even if the address signal ADS applied to the NOR gate N02 changes from logic "high" to "low" as shown in FIG. 4A, since the NMOS transistors N21 and N22 are in off-state, the first input terminals of the first and second NAND gates NA21 and NA22 are maintained at logic "low".

The first latch signal changed from logic "low" to "high" as shown in FIG. 4F is supplied to the first delay circuit 230, and the first delay circuit 230 generates the first delay signal delayed for the prescribed time as shown in FIG. 4G. The second input terminal of the second NAND gate is set to logic "high". Since the first delay signal of logic "low" is applied to the first input terminal of the second NAND gate NA22, the second latch signal is maintained at logic "high" as shown in FIG. 4H. Then the first feedback signal generated from the third NAND gate NA23 is changed from logic "high" to "low", as shown in FIG. 4D, by the first and second delay signals. The second feedbacks signal generated from the fourth NAND gate NA24 is changed from logic "low" to "high" as shown in FIG. 4E. As a result, the NMOS transistors N21 and N22 are turned on.

The NMOS transistors N21 and N22 are turned off during each delay time t of the first and second delay circuits 230 and 240, after the address transition detection signal ATDS is set to logic "low" and the activated state has started as shown in FIG. 4J. Since the pulse width of the address signal ADS is shorter than each delay time t of the first and second delay circuits 230 and 240, the address signal ADS of logic "low" is applied to the NOR gate N02. Since the first and second delay signals of logic "high" are applied to the second input terminals of the second and first NAND gates NA22 and NA21, respectively, the first latch signal generated from the first NAND gate NA21 is changed from logic "high" to "low" as shown in FIG. 4F, and the second latch signal generated from the second NAND gate NA22 is maintained at logic "high" as shown in FIG. 4H.

The PMOS transistor P23 of the address transition detection signal output circuit 250 is turned on and the NMOS transistor N27 is turned off by the first latch signal set to logic "low". The first latch signal set to logic "low" is fed to the first delay circuit 230, and the first delay circuit 230 generates the first delay signal delayed for the prescribed delay time. Then the PMOS transistors P23 and P24 are turned on. Since the PMOS transistors P23 and P24 are turned on, the address transition detection signal ATDS is set to logic "high" as shown in FIG. 3J and the activated state is completed.

Since the pulse width of the address signal ADS is shorter than each delay time t of the first and second delay circuits 230 and 240, the address signal ADS changed from "high" to "low" is not supplied to the first and second NAND gates NA21 and NA22 by the NMOS transistors N21 and N22. Therefore, the NMOS transistors N27 and N28 are maintained at on state during the time 2t which adds each delay time t of the first and second delay circuits 230 and 240, after which the NMOS transistors N21 and N22 are turned off for each delay time t of the first and second delay circuits 230 and 240, during which the NMOS transistors N21 and N22 are turned on and the outputs of the first and second NAND gates NA21 and NA22 are applied. Thus the address transition detection signal ATDS is set to logic "low".

In the above description, the address signal ADS changed from "low" to "high" has been described. Even if the address signal ADS changes from "high" to "low", the NMOS transistors N29 and N30 are turned on for the delay time 2t of the first and second delay circuits 230 and 240, and the address transition detection signal ATDS is set to logic "low".

FIGS. 5A to 5J are operational waveform charts of the address transition detection circuit of FIG. 2 when the address signal ADS of a short pulse is applied.

Figure 5:
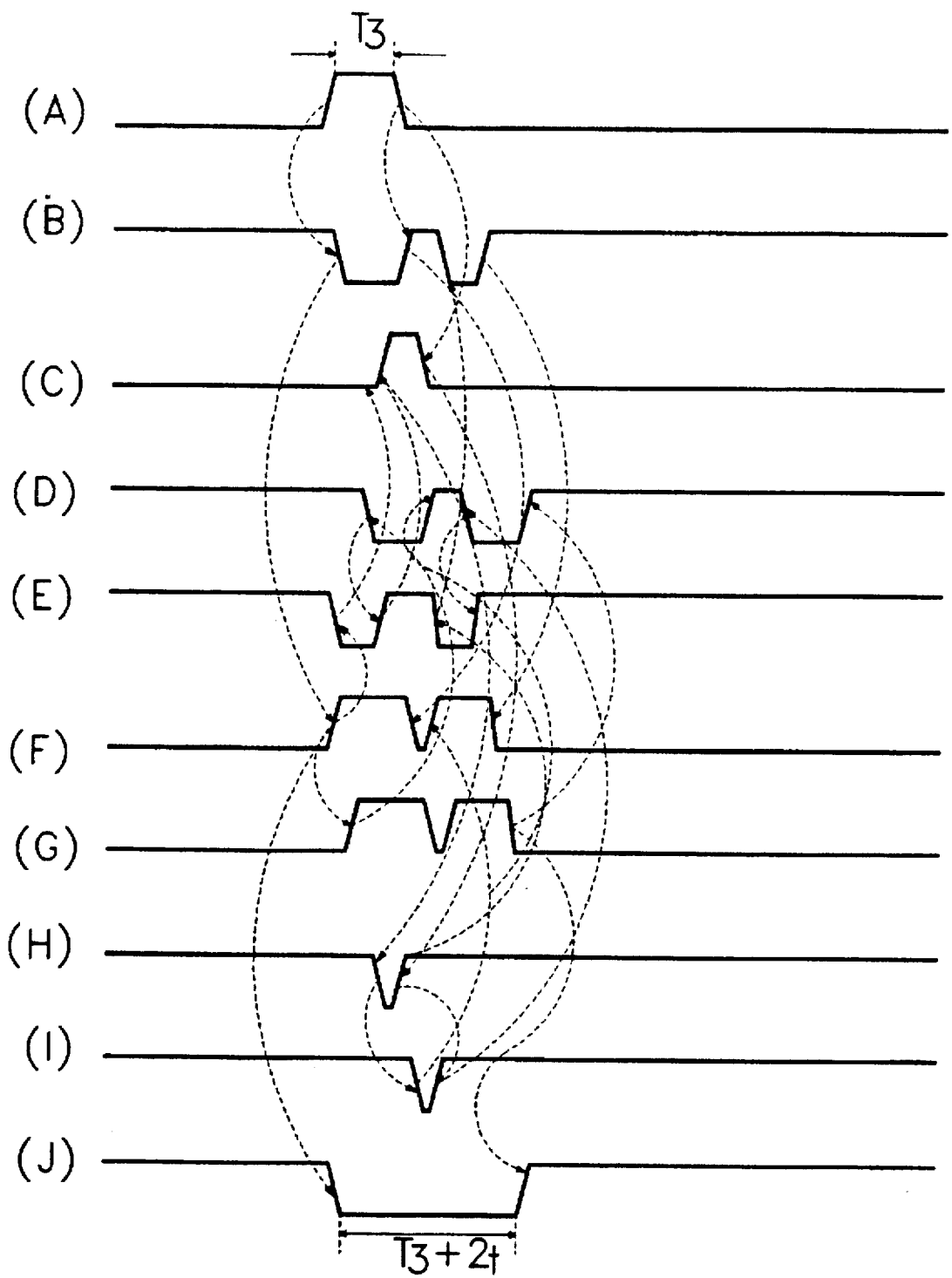

The chip select signal $\overline{CS}$ of logic "low" and the address signal ADS as indicated in FIG. 5A are supplied to the NOR gate N02. A pulse width T3 of the address signal ADS is shorter than a minimum width 2t of the address transition detection signal ATDS required to drive the internal circuit of the memory and is longer than one-half of the minimum width (That is, t<T3<2t).

If the address signal ADS is changed from logic "low" to "high", the NOR gate N02 generates the input logic operation signal changed from logic "high" to "low". Since the first and second latch signals generated from the first and second NAND gates NA21 and NA22, and the first and second delay signals generated from the first and second delay circuits 230 and 240 are maintained at the previous state, the NMOS transistor N21 and N22 are maintained at on-state. Then a signal changed from "high" to "low" as shown in FIG. 5B is applied to the first input terminal of the first NAND gate NA21. The second delay signal of logic "high" of the previous state is applied to the second input terminal of the first NAND gate NA21. The first latch signal generated from the first NAND gate NA21 is changed from logic "low", to "high" as shown in FIG. 5F. The PMOS transistor P23 of the address transition detection signal output circuit 250 is turned off and the NMOS transistor N27 is turned on. Since the NMOS transistor N28 is maintained at on-state by the second delay signal of logic "high" of the previous state, the address transition detection signal ATDS is set to logic "low" as shown in FIG. 5J and the activated state is started.

Meanwhile, the input logic operation signal of the NOR gate NO2 is inverted by the inverter I21, and the inverted input logic operation signal changed from logic "low" to "high" as shown in FIG. 5C is applied to the first input terminal of the second NAND gate NA22. The first delay signal of logic "low" of the previous state is supplied to the second input terminal of the second NAND gate NA22. Hence, the second latch signal generated from the second NAND gate NA22 is maintained at logic "high", irrespective of the logic state of the inverted input logic operation signal applied to the first input terminal, as indicated in FIG. 5H.

The first feedback signal generated from the third NAND gate NA23 is maintained at logic "high" by the first and second delay signals, as shown in FIG. 5D. Since the first and second latch signals are at logic "high", the second feedback signal generated from the fourth NAND gate NA24 is changed from "high" to "low" as shown in FIG. 5E, and the NMOS transistors N21 and N22 are turned off. Therefore, the input logic operation signal generated from the NOR gate NO2 is prevented from being transferred to the first and second NAND gates NA21 and NA22. Thus the signal applied to the first input terminal of the first NAND gate NA21 is maintained at logic "low" as shown in FIG. 5B., and the signal applied to the first input terminal of the second NAND gate NA22 is changed from logic "high" to "low" as shown in FIG. 5C. Hence, the first and second latch signals are maintained at logic "high" as shown in FIGS. 5F and 5H, respectively.

The first latch signal changed from logic "low" to "high" as shown in FIG. 5F is supplied to the first delay circuit 230, and the first delay circuit 230 generates the first delay signal delayed for the prescribed time t as shown in FIG. 5G. The second input terminal of the second NAND gate is set to logic "high". Since the NOR gate input logic operation signal of logic "low" is applied to the first input terminal of the second NAND gate NA22, the second latch signal is maintained at logic "high" as shown in FIG. 5H. The first feedback signal generated from the third NAND gate NA23 is changed from logic "high" to "low" by the first and second delay signals. The second feedbacks signal generated from the fourth NAND gate NA24 is changed from logic "low" to "high" as shown in FIG. 5E. The NMOS transistors N21 and N22 are turned on.

The input logic operation signal of logic "low" from the NOR gate NO2 shown in FIG. 5B is directly supplied to the first input terminal of the first NAND gate NA21, and the logic operation signal changed from logic "low" to "high" as shown in FIG. 5C is applied to the second input terminal of the second NAND gate NA22. Since the first delay signal is maintained at logic "high", the second latch signal generated from the second NAND gate NA22 is changed from logic "high" to "low" as shown in FIG. 5H. The second latch signal is supplied to the second delay circuit 240 and the second delay circuit 240 generates the second delay signal which is delayed for the delay time t and which is changed from logic "high" to "low" as shown in FIG. 5I.

After the second latch signal is set to logic "low" as shown in FIG. 5H, the second latch signal is delayed for the delay time t by the second delay circuit 240. If the address signal ADS applied to the NOR gate N02 is changed form logic "high" to "low" as shown in FIG. 5A before the second delay signal is set to logic "low" as shown in FIG. 5I, the input logic operation signal applied to the first input terminals of the first and second NAND gates NA21 and NA22 is changed from logic "low" to "high" and from logic "high" to "low", respectively, as shown in FIGS. 5B and 5C. Since the first and second delay signals are at logic "high", the first feedback signal generated from the third NAND gate NA23 is maintained at logic "low", and the second feedback signal generated from the fourth NAND gate NA24 is set to logic "high". Thus the NMOS transistors N21 and N22 are turned on.

Since the first and second delay signals generated from the first and second delay circuits 230 and 240 are at logic "high", the first latch signal is changed from logic "high" to "low" as shown in FIG. 5F, and the second latch signal is changed from logic "low" to "high" as shown in FIG. 5H. The NMOS transistor N29 is turned on by the second latch signal generated from the second NAND gate NA22, and the NMOS transistor N30 is maintained at on-state by the second delay signal of logic "high". Therefore, the address transition detection signal ATDS is maintained at logic "low" as shown in FIG. 5J. The first and second latch signals generated from the first and second NAND gates NA21 and NA22 are respectively applied to the first and second delay circuits 230 and 240 and delayed by the delay time t, thereby generating the first and second delay signals, respectively, as shown in FIG. 5G and 5I.

The first latch signal generated from the first NAND gate NA21 is changed from logic "low" to "high" by the second delay signal changed from logic "high" to "low", as shown in FIG. 5I. The first feedback signal generated from the third NAND gate NA23 is changed from logic "low" to "high" as shown in FIG. 5D. Since the first latch signal is at logic "high" and the second latch signal is at logic "low", the second feedback signal generated from the fourth NAND gate NA24 is set to logic "high" as indicated in FIG. 5E. The NMOS transistors N21 and N22 are turned on, and the input logic operation signal generated from the NOR gate N02 is transferred to the first input terminals of the first and second NAND gates NA21 and NA22. Since the address signal ADS is at logic "low", the input logic operation signal changed from logic "low" to "high" as shown in FIG. 5B is fed to the first input terminal of the first NAND gate NA21, and the input logic operation signal of logic "low" as shown in FIG. 5C is supplied to the first input terminal of the second NAND gate NA22. Since the second delay signal is maintained at logic "high", the first latch signal is changed from logic "high" to "low" as shown in FIG. 5F. The PMOS transistor P23 of the address transition detection signal output circuit 250 is turned on and the NMOS transistor N27 is turned off.

The first latch signal set to logic "low" is applied to the first delay circuit 230 and is delayed for the prescribed delay time t, thereby generating the first delay signal set to logic "low". Then the PMOS transistors P23 and P24 are turned on. Since the PMOS transistors P23 and P24 are turned on, the address transition detection signal ATDS is set to logic "high" as shown in FIG. 3J, and the activated state is completed. The NMOS transistors N27, N28, N29 and N30 are turned on during a time (T3+2t) obtained by adding the pulse width T3 of the address signal ADS and the delay time 2t of the first and second delay circuits. Consequently, the address transition detection signal ATDS is set to logic "low".

As may be apparent from the above description, when the phase of the input address signal is changed, the first and second latch signals generated from the first and second NAND gates have a different phase. Therefore, the address transition detection signal is set to logic "low" and the internal circuit of the memory device is activated. The first and second latch signals are set to logic "high" respectively by the second and first delay signals generated from the second and first delay circuits, the passive type NMOS transistors are turned off during each delay time t of the first and second delay circuits. Thus, the input logic operation signal generated from the NOR gate is not transferred to the first input terminals of the first and second NAND gates. Hence, the NMOS transistor of the address transition detection circuit is turned on during the time 2t which adds each delay time t of the first and second delay circuits during which the passive type NMOS transistor is turned off for the delay time t, during which the passive type NMOS transistor is turned on and the first and second latch signals pass through the first and second delay circuits.

Consequently, the address transition detection circuit of the present invention can prevent malfunction by generating the address transition detection signal having a minimum pulse width or a larger pulse width as necessary for driving the internal circuit, irrespective of the pulse width of the input address signal applied to the memory device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. An address transition detection circuit comprising:
    an address input circuit for generating an input logic operation signal by operating on a chip select signal and an address signal;
    a latch circuit for transferring said input logic operation signal and an inverted input logic operation signal to first input terminals of first and second NAND gates, respectively, and supplying first and second delay signals to second input terminals of said first and second NAND gates, so as to generate first and second latch signals;
    a feedback circuit for generating a second feedback signal, said second feedback signal transferring said input logic operation signals to the first input terminals of said first and second NAND gates when said first and second latch signals have an opposite phase;
    first and second delay circuits for generating said first and second delay signals by delaying said first and second latch signals for a prescribed delay time; and
    an address transition detection signal output circuit for receiving said first and second latch signals and said first and second delay signals, and generating an address transition detection signal having a pulse width longer than said prescribed delay time when said address signal is changed.

2. An address transition detection circuit as claimed in claim 1, wherein said latch circuit prevents said input logic operation signals from being transferred to said first and second NAND gates, when said first and second latch signals have the same phase.

3. An address transition detection circuit as claimed in claim 1, wherein said latch circuit includes:
    transistors for transferring said input logic operation signals to the first input terminals of said first and second NAND gates by said second feedback signal or for preventing said input logic operation signals from being transferred to said first and second NAND gates.

4. An address transition detection circuit as claimed in claim 3, wherein said transistors are NMOS transistors.

5. An address transition detection circuit as claimed in claim 1, wherein said latch circuit includes:
    voltage level adjusting means connected to the first input terminals of said first and second NAND gates, for adjusting a voltage level.

6. An address transition detection circuit as claimed in claim 5, wherein said voltage level adjusting means includes:
    an input terminal commonly connected to output terminals of said first and second NAND gates, and
    an output terminal connected to input terminals of said first and second NAND gates.

7. An address transition detection circuit as claimed in claim 5, wherein said voltage level adjusting means includes:
    a PMOS transistor and a first NMOS transistor of a CMOS transistor construction serially connected between a power voltage terminal and a ground voltage terminal.

8. An address transition detection circuit as claimed in claim 7, wherein said voltage level adjusting means further includes:
    a second NMOS transistor connected between said first NMOS transistor and said ground voltage terminal.

9. An address transition detection circuit as claimed in claim 1, wherein said feedback circuit includes:
    a fourth NAND gate for generating said second feedback signal, said fourth NAND gate having an input terminal connected to output terminals of said first and second NAND gates.

10. An address transition detection circuit as claimed in claim 9, wherein said feedback circuit further includes:
    a third NAND gate for transmitting a first feedback signal to said fourth NAND gate, said third NAND gate being connected to output terminals of said first and second delay circuits.

11. An address transition detection circuit as claimed in claim 10, wherein said first feedback signal is applied to a gate of said second NMOS transistor connected between said first NMOS transistor and said ground voltage terminal.

12. An address transition detection circuit as claimed in claim 1, wherein the address transition detection signal generated by said address transition detection signal output circuit has a pulse width longer than at least twice said prescribed delay time.

13. An address transition detection circuit comprising:

an address input circuit for generating an input logic operation signal by a logic operation of a chip select signal and an address signal having a given pulse width;

a latch circuit for generating first and second latch signals, said latch circuit including first and second NAND gates having first input terminals to which said input logic operation signal and an inverted input logic operation signal are transferred, said latch circuit further including voltage adjusting means for adjusting a voltage of the first input terminals of said first and second NAND gates;

a feedback circuit having a third NAND gate for generating a first feedback signal by said first and second delay signals, and having a fourth NAND gate for receiving said first feedback signal and said first and second latch signals and generating a second feedback signal;

first and second delay circuits for generating said first and second delay signals by delaying said first and second latch signals for a prescribed delay time; and an address transition detection signal output circuit for receiving said first and second latch signals and said first and second delay signals, and generating an address transition detection signal having a pulse width longer than said prescribed delay time of said first or second delay circuit when said address signal is changed.

14. An address transition detection circuit as claimed in claim 13, wherein said voltage level adjusting means includes:

a PMOS transistor and first and second NMOS transistors serially connected between a power voltage terminal and a ground voltage terminal.

15. An address transition detection circuit as claimed in claim 14, wherein said voltage level adjusting means includes:

an input terminal commonly connected to output terminals of said first and second NAND gates, and an output terminal connected to input terminals of said first and second NAND gates, said second NMOS transistor having a gate connected to said third NAND gate.

16. An address transition detection circuit as claimed in claim 13, wherein said said second feedback signal transfers said input logic operation signals to the first input terminals of said first and second NAND gates when said first and second latch signals have an opposite phase, and prevents said input logic operation signals from being transferred to said first and second NAND gates when said first and second latch signals have the same phase.

17. An address transition detection circuit as claimed in claim 13, wherein the address transition detection signal generated by said address transition detection signal output circuit has a pulse width longer than at least twice said prescribed delay time.

18. An address transition detection device comprising:

an address input circuit for generating an input logic operation signal by operating on a chip select signal and an address signal having a pulse width;

a latch circuit for receiving said input logic operation signal and an inverted input logic operation signal and generating first and second latch signals;

a feedback circuit coupled to said latch circuit for generating first and second feedback signals and controlling said latch circuit;

first and second delay circuits for generating first and second delay signals by delaying said first and second latch signals generated by said latch circuit for a prescribed delay time; and an address transition detection signal output circuit for receiving said first and second latch signals and said first and second delay signals, and generating an address transition detection signal having a pulse width longer than said prescribed delay time, irrespective of the pulse width of said address signal.

19. An address transition detection circuit device as claimed in claim 18, wherein said second feedback signal prevents said input logic operation signals from being transferred to first and second NAND gates of said latch circuit, when said first and second latch signals have the same phase.

20. An address transition detection circuit device as claimed in claim 19, wherein said latch circuit includes:

transistors for transferring said input logic operation signals to first input terminals of said first and second NAND gates or for preventing said input logic operation signals from being transferred to said first and second NAND gates.

21. An address transition detection circuit device as claimed in claim 18, wherein said latch circuit includes:

voltage level adjusting means connected to first and second NAND gates of said latch circuit, for adjusting a voltage level thereof.

22. An address transition detection circuit device as claimed in claim 21, wherein said voltage level adjusting means includes:

an input terminal commonly connected to output terminals of said first and second NAND gates, and an output terminal connected to input terminals of said first and second NAND gates.

23. An address transition detection circuit device as claimed in claim 21, wherein said voltage level adjusting means includes:

a PMOS transistor and a first NMOS transistor serially connected between a power voltage terminal and a ground voltage terminal.

24. An address transition detection circuit device as claimed in claim 23, wherein said voltage level adjusting means further includes:

a second NMOS transistor connected between said first NMOS transistor and said ground voltage terminal.

25. An address transition detection circuit device as claimed in claim 20, wherein said feedback circuit includes:

a fourth NAND gate for generating said second feedback signal, said fourth NAND gate having an input terminal connected to output terminals of said first and second NAND gates.

26. An address transition detection circuit device as claimed in claim 25, wherein said feedback circuit further includes:

a third NAND gate for transmitting said first feedback signal to said fourth NAND gate, said third NAND gate being connected to output terminals of said first and second delay circuits.

27. An address transition detection circuit device as claimed in claim 24, wherein said first feedback signal is applied to a gate of said second NMOS transistor connected between said first NMOS transistor and said ground voltage terminal.

28. An address transition detection circuit as claimed in claim 18, wherein the address transition detection signal generated by said address transition detection signal output circuit has a pulse width longer than at least twice said prescribed delay time.

29. A method of detecting an address transition for a memory device, comprising the steps of:

generating an input logic operation signal and an inverted input logic operation signal by operating on a chip select signal and an address signal;

receiving said input logic operation signals and generating first and second latch signals using a latch circuit;

generating first and second delay signals by delaying said first and second latch signals for a prescribed delay time;

generating first and second feedback signals by using said first and second delay signals to control said latch circuit; and receiving said first and second latch signals and said first and second delay signals, and generating an address transition detection signal having a pulse width longer than said prescribed delay time, irrespective of the pulse width of said address signal.

30. A method as claimed in claim 29, wherein said second feedback signal prevents said input logic operation signals from being transferred to said latch circuit, when said first and second latch signals have the same phase.

31. A method as claimed in claim 29, wherein said step of generating said first and second latch signals includes the step of:

transferring said input logic operation signals to first input terminals of first and second NAND gates in said latch circuit.

32. A method as claimed in claim 29, wherein the address transition detection signal has a pulse width longer than at least twice the prescribed delay time.

* * * * *